United States Patent
Lee et al.

(10) Patent No.: US 9,284,196 B2
(45) Date of Patent: Mar. 15, 2016

(54) GRAPHENE-LIKE NANOSHEET STRUCTURE NETWORK ON A SUBSTRATE AND THE METHOD FOR FORMING THE SAME

(71) Applicant: Nanomaterial Innovation Ltd., Columbus, OH (US)

(72) Inventors: LYJames Lee, Columbus, OH (US); Jianfeng Yu, Columbus, OH (US); Ying-Chieh Yen, Columbus, OH (US)

(73) Assignee: NANOMATERIAL INNOVATION LTD., Columbus, OH (US)

( * ) Notice: Subject to any disclaimer, the term of this patent is extended or adjusted under 35 U.S.C. 154(b) by 4 days.

(21) Appl. No.: 14/335,072

(22) Filed: Jul. 18, 2014

(65) Prior Publication Data

US 2015/0023860 A1    Jan. 22, 2015

Related U.S. Application Data

(60) Provisional application No. 61/958,089, filed on Jul. 19, 2013.

(51) Int. Cl.

| | |
|---|---|
| *C01B 31/02* | (2006.01) |
| *C23C 16/26* | (2006.01) |
| *C01B 31/04* | (2006.01) |
| *C01B 31/30* | (2006.01) |
| *C01B 31/36* | (2006.01) |
| *C23C 16/02* | (2006.01) |
| *C23C 16/32* | (2006.01) |

(52) U.S. Cl.
CPC ............ *C01B 31/0453* (2013.01); *C01B 31/301* (2013.01); *C01B 31/36* (2013.01); *C23C 16/0272* (2013.01); *C23C 16/325* (2013.01)

(58) Field of Classification Search
CPC .. C01B 31/0438; C01B 31/0446; C23C 16/26
See application file for complete search history.

(56) References Cited

U.S. PATENT DOCUMENTS

| | | | | |
|---|---|---|---|---|
| 2012/0003547 | A1* | 1/2012 | Raj | ...................... H01M 4/0404 429/322 |
| 2012/0141799 | A1* | 6/2012 | Kub | ...................... B82Y 30/00 428/408 |
| 2014/0144541 | A1* | 5/2014 | Moreira De Carvalho | ............... B82Y 30/00 138/177 |

OTHER PUBLICATIONS

Guo, Hui-Lin, et al., "A Green Approach to the Synthesis of Graphene Nanosheets". ACS Nano, vol. 3, No. 9, 2653-2659, 2009.*
Stankovich, Sasha, et al., "Synthesis of graphene-based nanosheets via chemical reduction of exfoliated graphite oxide". Carbon 45 (2007) 1558-1565.*
Srinivas, G., et al., "Synthesis of graphene-like nanosheets and their hydrogen adsorption capacity". Carbon (2009), doi: 10/1016/j.carbon.2009.10.003; pp. 1-6.*
Arsat, R., et al., "Graphene-like nano-sheets for surface acoustic wave gas sensor applications". Chemical Physics Letters 467 (2009) 344-347.*
Zhang, Pengfei, et al., "Mesoporous graphene-like carbon sheet: high-power supercapacitor and outstanding catalyst support". J. Mater. Chem. A, 2014, 2, 12262-12269.*
Wang, Guoxiu, et al., "Facile Synthesis and Characterization of Graphene Nanosheets". J. Phys. Chem. C 2008, vol. 112, No. 22, 8192-8195.*

* cited by examiner

*Primary Examiner* — Bret Chen
(74) *Attorney, Agent, or Firm* — WPAT, PC; Justin King

(57) ABSTRACT

A facile method to produce covalently bonded graphene-like network coated on various solid substrates is disclosed in the present invention. According to one embodiment, a combination of chemical vapor deposition (CVD) of carbon sources and a silicon compound with or without a metal containing compound under an inert gas flow is processed at high temperatures to produce covalent carbide bonding among graphene-like structures and between graphene-like structures and substrate surface.

24 Claims, 10 Drawing Sheets

A tube furnace with 2" quartz tube, vacuum flange and 30 segments temperature controller.

Schematic of a delivery system for liquid carbon sources.

Schematic of a delivery system for gas carbon sources.

Photos of (a) a quartz plate and (b) a graphene-like network coated quartz plate using CVD of naphthalene.

SEM images of free standing graphene like coating.

(a) quartz, (b) thermally reduced commercial graphene from graphene oxide, (c) quartz surface coated by CVD of naphthalene with carbide source, and (d) quartz surface coated by CVD of naphthalene without carbide source.

Photos of (a) a Si wafer and (b) a graphene-like network coated Si wafer using CVD of naphthalene.

Photos of a graphene-like network coated quartz plate using CVD of benzene.

Photos of a graphene-like network coated quartz plate using CVD of ethylene.

|  | Steel coated by DLC | bare steel | nanopaper based coating | ethylene based coating | naphthalene based coating |
| --- | --- | --- | --- | --- | --- |
| roughness RMS (nm) | 10.4 | 10.7 | 1.8 | 1.9 | 0.54 |
| coating thickness (nm) | ~1000 | N/A | 438.9 | 565.2 | N/A |
| friction coefficient | 0.0509 | 0.1218 | 0.0660 | 0.0358 | 0.0413 |
| Young's modulus (GPa) | 184 | 126 | 158 | 164 | 170 |
| Hertzian hardness (GPa) | 29.4 | 15.6 | 19.8 | 20.9 | 22.5 |
| scratch depth (nm) | 13.0 | 23.6 | 24.0 | 15.0 | 0.87 |
| sheet resistance ($\Omega/\square$) | 0.03-0.5 | N/A | 1-18K | 39-65 | 12-24K |

Table 1. Property comparison of DLC coating on steel, graphene-like network coated quartz plate using graphene nanopaper, CVD of naphthalene, benzene and ethylene.

Figure 10

GRAPHENE-LIKE NANOSHEET STRUCTURE NETWORK ON A SUBSTRATE AND THE METHOD FOR FORMING THE SAME

TECHNICAL FIELD OF THE INVENTION

The present invention relates to the network formation and coating of graphene-like nanosheets on the solid surfaces using chemical vapor deposition (CVD) of solid, gas, or liquid carbon sources together with a carbide source such as silicone rubber under an inert gas flow at elevated temperatures. Reactive carbon species from CVD form graphene-like structure and such structure is covalently bonded between each other and on the solid surface via carbide formation during the process. The solid surfaces include, but not limited to, ceramic, quartz, glass, silicon wafer, glass and quartz fibers, metals, metal alloys or the like. The presence of covalently-bonded graphene-like network coating on their surfaces makes non-conductive substrates thermally and electrically conductive and hydrophilic surfaces hydrophobic. It allows multiple graphene-like layers to be strongly bounded on solid surfaces by covalent bonds to achieve high temperature stability and high mechanical strength. Such coating also provides excellent corrosion resistance, low surface friction and useful semi-conductive and optical properties. By adjusting the content and type of CVD carbon sources, silicon and metal containing compounds, the aforementioned coating properties can be tuned. The present invention provides articles and coating useful in electromagnetic interference shielding, corrosion resistance, surface friction reduction, surface binding reduction, electric heating, and as components of semiconductor, solar cell and optical devices.

BACKGROUND OF THE INVENTION

Carbon allotropes encompass 0-D fullerenes, 1-D nanotubes, 2-D graphenes, and 3-D graphite and diamond, among which graphenes are of particular interests due to their unique features. The 2-D graphenes are one-atom thick nanosheet composed of hexagonal structure of carbon atoms, giving rise to exceptional electrical conductivity ($8\times10^5$ S/m), high thermal conductivity (about 5300 W m$^{-1}$ K$^{-1}$), large surface areas (>2600 m$^2$/g), strong mechanical properties (tensile strength of 130 GPa and Young's modulus of 1 TPa), low friction coefficient and excellent corrosion resistance.

The possible low-cost production of graphenes from graphite via oxidation-intercalation, exfoliation and reduction processes makes it an attractive conductor for many purposes. High-degree dispersion of graphenes in the polymer matrix can be realized, but it is not accessible for ceramics, glass, metals and semi-conductor materials because they are processed at temperatures above 400° C., at which graphenes are not thermally stable. Therefore, it is of particular importance to coat the surfaces of those solids with a thin layer of graphene to gain many, if not all, of its advantages.

Since the graphene surface is very inert, individual graphene layers can be easily peeled off from a multi-layer stack and direct coating of graphene layers on the surface of solids requires the use of adhesives, which often cannot withstand high temperatures. Furthermore, the presence of adhesives may reduce the graphene properties.

In the present invention, we describe a novel approach to coat the solid surfaces with graphene-like network at elevated temperatures, during which graphene-like structure is formed from chemical vapor deposition of solid, liquid or gas carbon sources and deposited on the surface of solid substrates. In the presence of silicon, metal and sometimes a small amount of oxygen, the edge carbon atoms of graphene-like structure may form covalent bonds such as (—C—O—Si—), (—C—Si—), (—C—O-M-) and/or (—C-M-) among themselves and with the silicon and/or metal atoms in the ceramics, glass, quartz, silicone wafer and metals. Because of this, the coated graphene-like network has strong bonding among graphene-like structures and with the solid substrates, which can withstand high stresses and high temperatures even in the air. This graphene-like network coating endows the solids with unique properties, allowing them to prospect as an attractive material for a variety of potential applications.

As an example, the vast majority of useful ceramics, glass and quartz are electrical and thermal insulators. To make their surfaces electrically and thermally conductive, a coating layer comprised of a dispersion of noble metal powders, e.g., platinum, gold, or silver, to give the electrical conductivity in the order of 1,000 S/m is often applied. In spite of high cost, noble metals are still used to a great extent because non-noble metal powders such as copper, nickel, or aluminum, are easy to form high resistance surface oxides. The expense of noble metals and the disadvantages of using non-noble metal powders have prompted researchers to search for alternative approaches. The present invention of covalently-bonded graphene coating serves as an excellent solution.

In light of their high electrical and thermal conductivity, high mechanical strength, excellent resistance to acid and base, low friction, high hydrophobicity, tunable semi-conductive and optical properties, and strong bonding among graphene-like structures and between graphene-like structures and ceramics, glass and quartz, the covalently-bonded graphene-like network coating of ceramics, glass and quartz can find many applications. For example, the current collector of the energy conversion devices is often exposed to an extremely corrosive environment. Because of the severe corrosion problems, many metals are not practical for such use. The covalently-bonded graphene-like network coating of ceramics, glass and quartz are a promising alternative.

Another example is the application for heat-dissipation systems of microelectronic packaging. As the speed of processor increases, the generated heat would dramatically increase. Thus, the application of high thermal conductivity materials is essential to thermal management in compact packaging systems. Since graphene has a very high thermal conductivity, the graphene-like network coated solids may be used there.

Because graphene has a very low friction coefficient, the covalently-bonded graphene-like network coating of solids can be used as ball bearing and for many friction and binding reduction applications. A combination of high thermal conductivity, desirable electric conductivity/resistivity and low binding surface makes the covalently-bonded graphene-like network coating of ceramics, glass and quartz an excellent candidate for energy saving and non-sticking cooking ware.

Yuegang Zhang et al disclosed a method for deposition of graphene on various dielectric substrates in Nano Lett. 2010, 10, 1542-1548. A single-layer graphene is formed through surface catalytic decomposition of hydrocarbon precursors on thin copper films pre-deposited on dielectric substrates. The copper films de-wet and evaporate during or immediately after graphene growth, resulting in graphene deposition directly on the bare dielectric substrates. However, copper is applied in the process.

US 20110070146 A1 disclosed a method of manufacturing graphene, a graphene comprising a base member, a hydrophilic oxide layer formed on the base member, and a hydrophobic metal catalyst layer formed on the oxide layer. The graphene grown on the metal catalyst layer and then apply water to the graphene member. At a final step, the metal catalyst layer is separated from the oxide layer to obtain the graphene. In the method, an etching process is required to remove the metal catalyst layer.

SUMMARY OF THE INVENTION

In light of the above background, in order to fulfill the industrial requirements. One objective of the invention is to provide a method with using a polymer as a raw material for coating a nanosheet structure network on a substrate, wherein the method comprises the steps of: providing a substrate and a polymer, wherein the polymer is selected from one of the group and combinations thereof consisting of a Si containing compound; decomposing the Si containing compound in a furnace or the quartz tubes of a furnace to form a gas composition by heating at 500 to 1500° C. in an air free environment; providing an argon gas as a carrier to deliver a hydrocarbon compound vapor to the furnace or quartz tubes of the furnace at 500 to 1500° C., so as to form a reactive species which is the gas composition decomposed from the Si containing compound and the hydrocarbon compound vapor; and depositing the reactive species on the substrate in the furnace or quartz tubes of the furnace at 500 to 1500° C. to form a nanosheet structure network having a covalent bond to the substrate.

Another objective of the invention is to provide a method without using a polymer as a raw material for coating a nanosheet structure network on a substrate, wherein the method comprises the steps of: providing a substrate into a furnace or quartz tubes of the furnace; heating the furnace or quartz tubes of the furnace at 500 to 1500° C. in an air free environment; providing an argon gas as a carry gas into the quartz tubes of the furnace at 500 to 1500° C. to deliver a vapor, wherein the vapor is consisting of a hydrocarbon compound and a silicon compound; and depositing the vapor on the substrate in the furnace or quartz tubes of the furnace at 500 to 1500° C. so as to form a nanosheet structure network having a covalent bond to the substrate.

The present invention relates to produce covalently-bonded graphene-like network coating on various solid substrates using a combination of CVD of carbon sources and a carbide source such as silicon material with or without metal containing compounds under an inert gas flow at high temperatures. The solid substrates can be ceramics, glass, quartz, silicon wafers, metals, metal alloys or any solid materials which can stand high temperatures. They can be in shapes such as plates, fibers, spheres, films or any regular or irregular shapes. The carbon sources can be, but not limited to, solids like naphthalene, liquids like benzene, or gases like ethylene and methane. The silicon and metal containing compounds can be, but not limited to, silicon-containing polymers with and without fillers, cyano-containing polymers or compounds, metal halide, and metallocenes.

The solid substrates are placed in an air free environment such as an inert gas purged furnace at temperatures ranging from 500 to 1500° C., preferably 750 to 950° C. b The carbon sources are turned to the gas phase in a separate temperature zone and blown into the furnace from one end under a pre-specified inert gas flow. The silicon/metal containing compounds can be co-placed in the furnace with the substrates or heated to 500 to 1000° C., preferably 750 to 950° C., to vaporize and the formed gases are blown into the furnace from a separate inlet under a pre-specified inert gas flow. It is believed that the carbon sources form graphene-like structures on the substrate surface under the high temperature by CVD and the edge carbon atoms of graphene-like structures may form covalent bonds such as (—C—O—Si—), (—C—Si—), (—C—O-M-) or (—C-M-) among themselves and with the silicon and/or metal atoms in the furnace and on the substrate surface.

The other objective of the invention is to provide a part or all of an article or a device comprising a surface having a nanostructure network bonding to the surface by a carbide bond, wherein Raman spectra of the nanostructure network have a G band at 1594±5 cm$^{-1}$ and a D band at 1338±5 cm$^{-1}$. Because Raman spectra of the nanostructure network is very similar to one of the graphene, the nanostructure is a graphene-like network. Furthermore, the nanosheet structure network has a carbide bond to the substrate. The carbide bond is selected from the group and combinations thereof consisting of (-Carbon-Oxygen-Silicon-), (-Carbon-Silicon-), (-Carbon-Oxygen-Metal-), (-Carbon-Metal-), (-Carbon-Nitrogen-), (-Carbon-Nitrogen-Metal-). As a result, the surface having the graphene-like network can withstand high stresses and high temperatures even in the air and this graphene-like network coating endows the solids with unique properties, allowing them to protect as an attractive material for a variety of potential applications.

BRIEF DESCRIPTION OF THE DRAWINGS

FIG. 10, illustrates a Table 1, property comparison of DLC coating on steel, graphene-like network coated quartz plate using graphene nanopaper, CVD of naphthalene, benzene and ethylene.

DETAILED DESCRIPTION OF THE PREFERRED EMBODIMENTS

Figure 1:
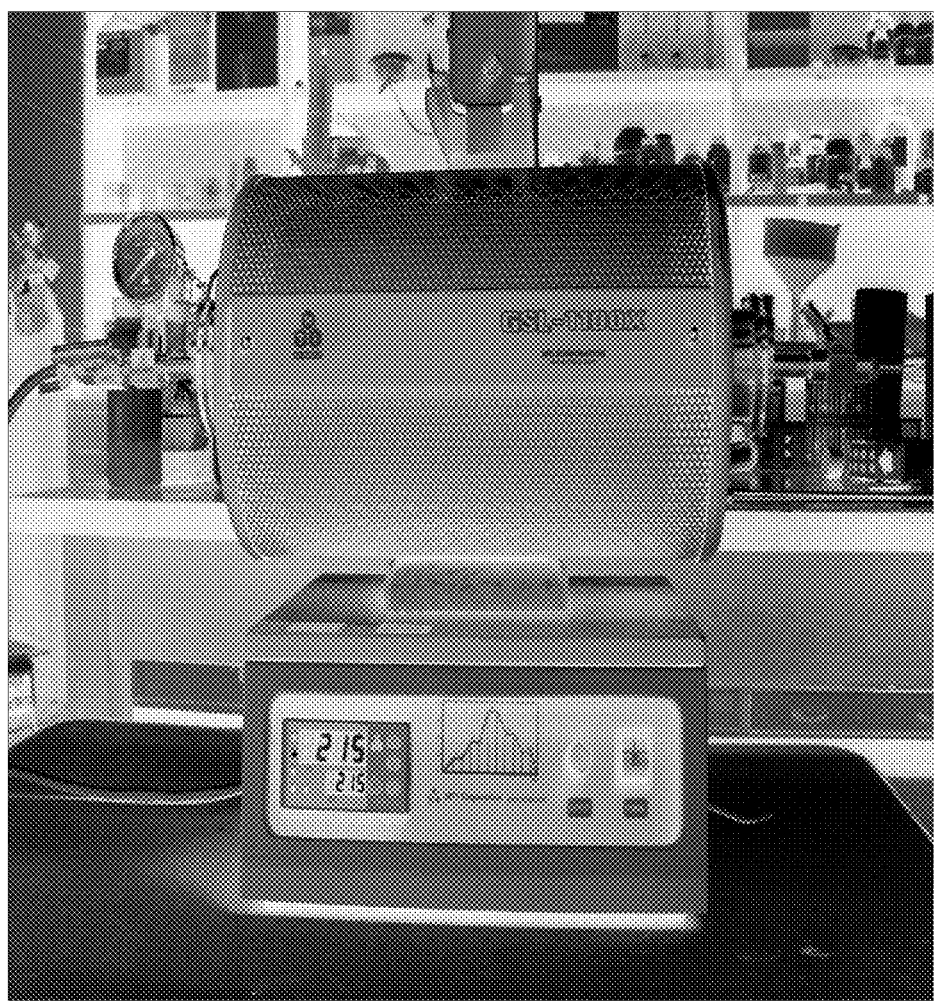
FIG. 1. A tube furnace with 2" quartz tube, vacuum flange and 30 segments temperature controller.

In one aspect, the invention relates to methods for coating a nanosheet structure network on a substrate. One method comprises the steps of: providing a substrate and a polymer, wherein the polymer is selected from one of the group and combinations thereof consisting of a Si containing compound; decomposing the Si containing compound in a furnace or the quartz tubes of a furnace to form a gas composition by heating at 500 to 1500° C. in an air free environment; providing an argon gas as a carrier to deliver a hydrocarbon compound vapor to the furnace or quartz tubes of the furnace at 500 to 1500° C., so as to form a reactive species which is the gas composition decomposed from the Si containing compound and the hydrocarbon compound vapor; and depositing the reactive species on the substrate in the furnace or quartz tubes of the furnace at 500 to 1500° C. to form a nanosheet structure network having a covalent bond to the substrate.

In one embodiment, the substrate comprises: ceramics, quartz, glass, silicon wafer and metals.

In another embodiment, the metals comprise structural steels, carbon steels, copper, titanium and the alloys thereof.

In order to perform the depositing the reactive species on the metal surface well, the metal surface is usually modified for the purpose.

In one embodiment, the metal surface is pre-treated with a thin layer SiO2 coating.

For covalently bonding the nanosheet structure network to the substrates, a silicon containing compound or a nitrogen containing polymer is used for the formation of the covalent bond in the method.

In one embodiment, the Si containing compound is selected from the group and combinations thereof consisting of silicone rubber, polydimethylsiloxane, organosilicon, silane-grafted polymers, silicon-containing metallocene polymers, polydimethylsiloxane and methyltrichlorosilane ($CH_3$—Si—$Cl_3$). The preferred Si containing compound is polydimethylsiloxane and methyltrichlorosilane ($CH_3$—Si—$Cl_3$).

In another embodiment, the Si containing compound further comprises fillers, gold, copper halide, and metallocenes.

In other embodiment, the nitrogen containing polymer is selected from the group and combinations thereof consisting of polyacrylonitrile, cyano-polyphenylene vinylene polymers, tetrazole-containing polymers, cyanophosphazene polymers.

In the step of decomposing the Si containing compound in the quartz tubes of the furnace or other furnace to form a gas composition by heating at 500 to 1500° C. in an air free environment.

In a preferably embodiment, the temperature ranges from 750 to 950° C.

In one embodiment, an air free environment is prepared by purging argon.

In the steps of: providing an argon gas as a carrier to deliver a hydrocarbon compound vapor to the quartz tubes of the furnace or other furnace at 500 to 1500° C., so as to form a reactive species which is the gas composition decomposed from the Si containing compound and the hydrocarbon compound vapor; and depositing the reactive species on the substrate in the quartz tubes of the furnace or other furnace at 500 to 1500° C. to form a nanosheet structure network having a covalent bond to the substrate.

In one embodiment, the hydrocarbon compound comprises: ketones, aldehydes, esters, alkane, alkene, and alkyne.

In another embodiment, the alkene is selected from the group and combinations thereof consisting of naphthalene, benzene, toluene, xylene, ethylene.

Furthermore, the temperature operated in the above steps is required high enough to form the covalent bond among the nanosheet structure network and with the substrate.

In a preferably embodiment, the temperature ranges from 750 to 950° C.

The nanosheet structure network is a graphene-like network and bonded to the substrate via a covalent bond.

In one embodiment, the covalent bond is a carbide bond.

In one embodiment, the carbide bond is selected from the group and combinations thereof consisting of (-Carbon-Oxygen-Silicon-), (-Carbon-Silicon-), (-Carbon-Oxygen-Metal-), (-Carbon-Metal-), (-Carbon-Nitrogen-), (-Carbon-Nitrogen-Metal-).

The invention also provides another method for coating a nanosheet structure network on a substrate, wherein the another method comprising the steps of: providing a substrate into a furnace or quartz tubes of the furnace; heating the furnace or quartz tubes of the furnace at 500 to 1500° C. in an air free environment; providing an argon gas as a carry gas into the quartz tubes of the furnace at 500 to 1500° C. to deliver a vapor, wherein the vapor is consisting of a hydrocarbon compound and a silicon compound; and depositing the vapor on the substrate in the furnace or quartz tubes of the furnace at 500 to 1500° C. so as to form a nanosheet structure network having a covalent bond to the substrate.

In one embodiment, the substrate comprises: ceramics, quartz, glass, silicon wafer and metals.

In another embodiment, the metals comprise structural steels, carbon steels, copper, titanium and the alloys thereof.

In order to perform the depositing the reactive species on the metal surface well, the metal surface is usually modified for the purpose.

In one embodiment, the metal surface is pre-treated with a thin layer SiO2 coating.

In the steps of: heating the furnace or quartz tubes of the furnace at 500 to 1500° C. in an air free environment; providing an argon gas as a carry gas into the quartz tubes of the furnace at 500 to 1500° C. to deliver a vapor, wherein the vapor is consisting of a hydrocarbon compound and a silicon compound; and depositing the vapor on the substrate in the furnace or quartz tubes of the furnace at 500 to 1500° C. so as to form a nanosheet structure network having a covalent bond to the substrate.

The temperature operated in the above steps is required to high enough to form the covalent bond among the nanosheet structure network and with the substrate.

In a preferably embodiment, the temperature ranges from 750 to 950° C.

In one embodiment, an air free environment is prepared by purging argon.

The hydrocarbon compound and the silicon compound are used as the source of the vapor. The vapor is reactive and then deposited on the substrate placed in the furnace or quartz tubes of the furnace at 500 to 1500° C. to form a nanosheet structure network, wherein the nanosheet structure network having a covalent bond to the substrate.

In one embodiment, the hydrocarbon compound is selected from the group and combinations thereof consisting of benzene, toluene, xylene.

In one embodiment, the silicon compound is tetraalkyl orthosilicate.

In another embodiment, the preferred silicon compound is tertaethyl orthosilicate.

In other embodiment, the silicon containing compound further comprises fillers, gold, copper halide, and metallocenes.

The nanosheet structure network is a graphene-like network and bonded to the substrate via a covalent bond.

In one embodiment, the covalent bond is a carbide bond.

In one embodiment, the carbide bond is selected from the group and combinations thereof consisting of (-Carbon-Oxygen-Silicon-), (-Carbon-Silicon-).

In another aspect, the invention is to provide a substrate comprising a surface having a nanostructure network bonding to the surface by a carbide bond, wherein Raman spectra of the nanostructure network has a G band at 1594±5 $cm^{-1}$ and a D band at 1338±5 $cm^{-1}$. Because Raman spectra of the nanostructure network is very similar to one of graphene, the nanostructure is the graphene-like nanosheet network.

In one embodiment, the carbide bond is selected from the group and combinations thereof consisting of (-Carbon-Oxygen-Silicon-), (-Carbon-Silicon-), (-Carbon-Oxygen-Metal-), (-Carbon-Metal-), (-Carbon-Nitrogen-), (-Carbon-Nitrogen-Metal-).

In the invention, the substrate comprising the surface having the graphene-like nanosheet network bonding to the surface by the carbide bond possesses high electrical and thermal conductivity, high mechanical strength, excellent resistance to acid and base, low friction, high hydrophobicity, tunable semi-conductive and optical properties. The present strong bonding among graphene-like nanosheet structures and between graphene-like nanostructure structures and ceramics, glass and quartz, the covalently-bonded graphene-like network coating of ceramics, glass and quartz can find many applications.

In one embodiment, the substrate is on or forming all or part of a solar cell.

In one embodiment, the substrate is on or forming all or part of a semiconductor component.

In one embodiment, the substrate is on or forming all or part of an optical device.

In one embodiment, the substrate is on or forming all or part of a corrosive-resistance article.

In one embodiment, the substrate is on or forming all or part of a non-sticking cooking ware.

In one embodiment, the substrate is on or forming all or part of a heat dissipation device.

In accordance with the foregoing summary, the following presents a detailed description of the example of the present invention, which is presently considered the best mode thereof. However, this invention can also be applied extensively to other embodiments, and the scope of this present invention is expressly not limited except as specified in the accompanying claims.

In accordance with the foregoing summary, the following presents a detailed description of the preferred embodiments of the present invention, which is presently considered the best mode thereof.

Figure 2:
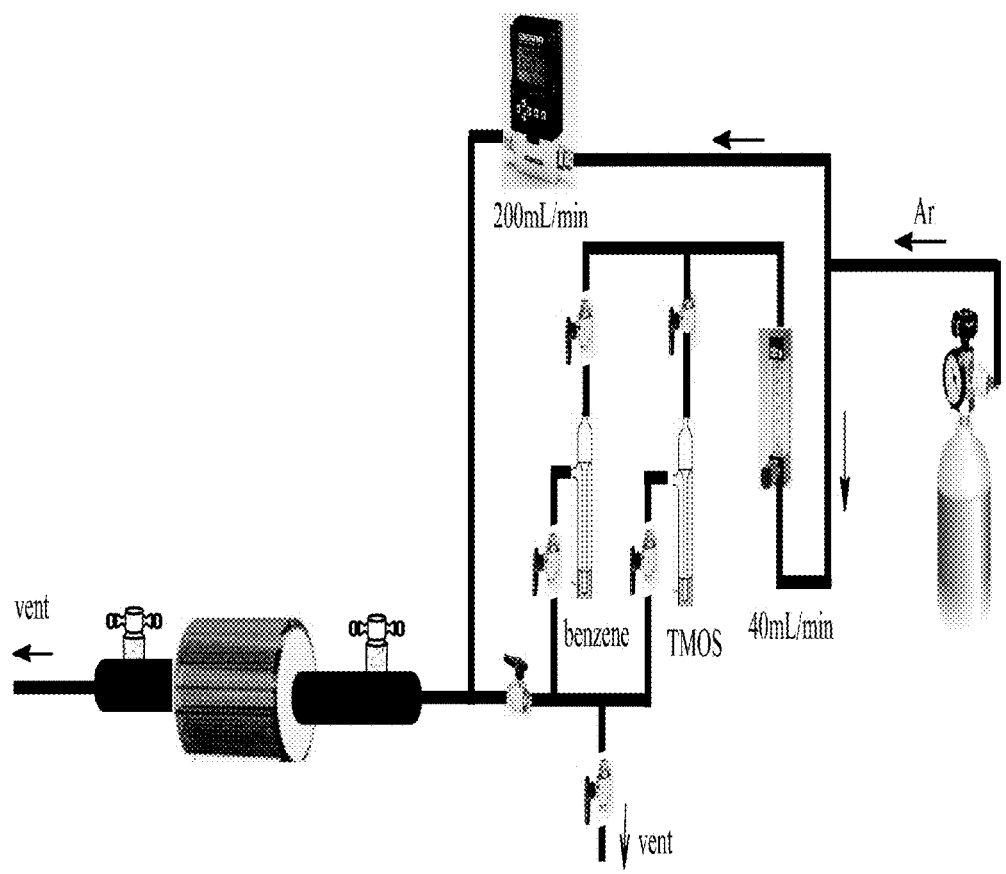
FIG. 2. Schematic of a delivery system for liquid carbon sources.
Figure 3:
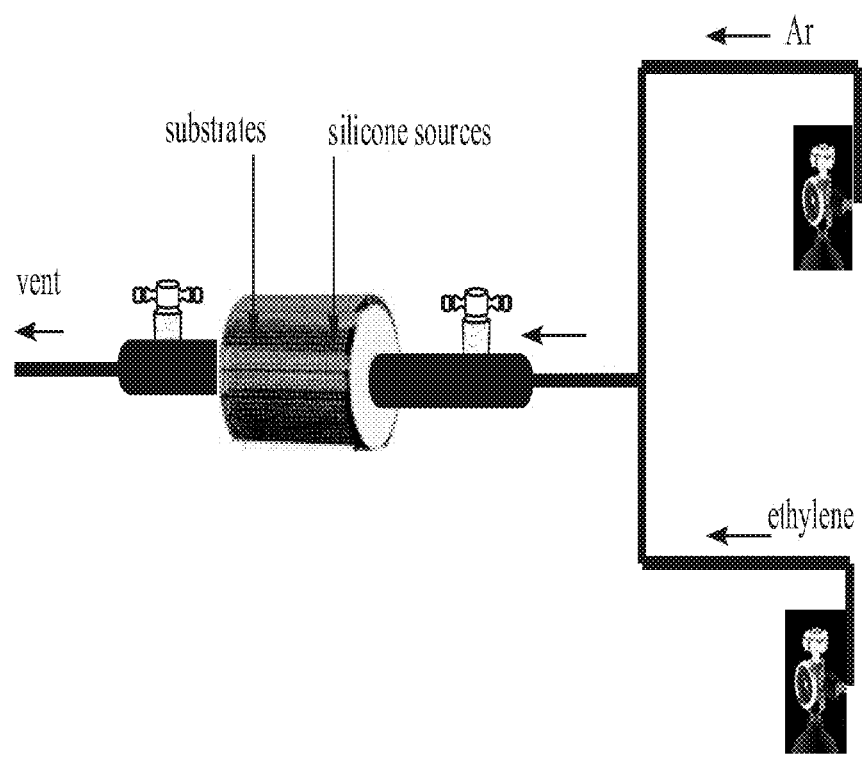
FIG. 3. Schematic of a delivery system for gas carbon sources.

Various designs can be used to generate an inert gas environment which can reach high temperatures for the process. As an example, a tube furnace with a quartz tube and vacuum flange was employed for thermal treatment of solid substrates and silicon/metal compounds as well as the solid carbon sources as indicated in FIG. 1. For liquid carbon sources, a delivery system shown in FIG. 2 is connected to the furnace. For gas carbon sources, a different delivery system shown in FIG. 3 is connected to the furnace.

A broad range of solid substrates, carbon sources and silicon or metal containing compounds can be used in the process. The following examples represent some, but not all, possible combinations.

Example 1

Figure 4:
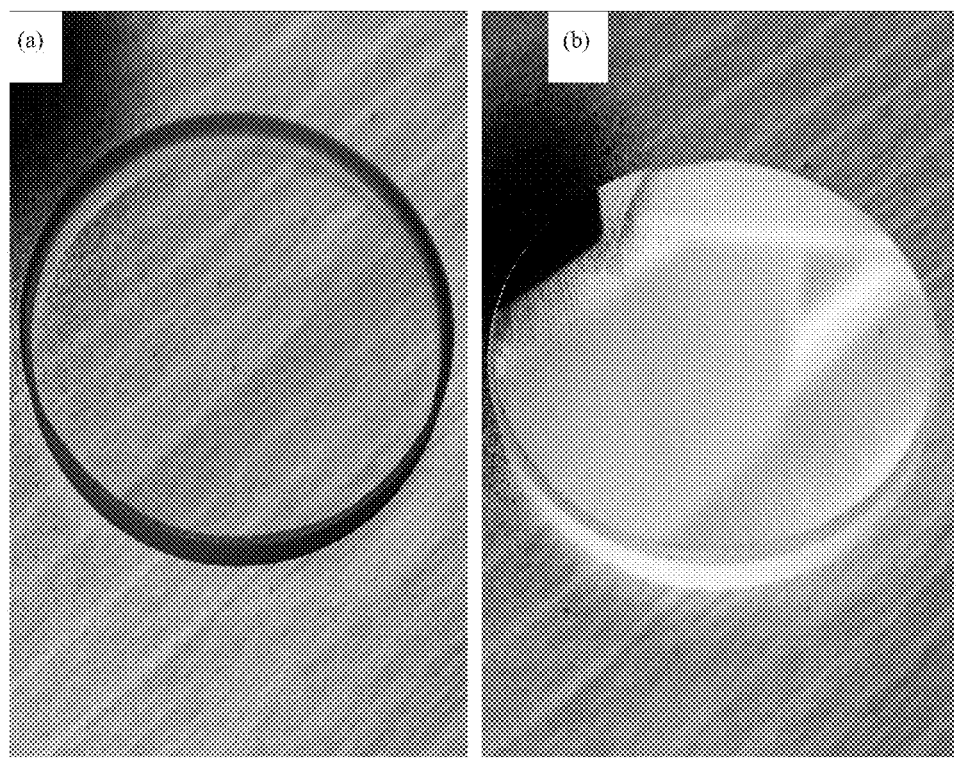
FIG. 4. Photos of (a) a quartz plate and (b) a graphene-like network coated quartz plate using CVD of naphthalene.

Silicon Carbide (and/or Silicon Oxycarbide) Bonded Graphene-Like Network Coated on Quartz Plates Using CVD of a Solid Carbon Source and a Silicone Source A solid carbon source, naphthalene (purchased from Aldrich, USA) with a purity of 99%, was used for the purpose of graphene formation and surface coating. Two 1/16" thick quartz plates with 1"×1" dimension and a piece of silicon-containing polymer or cyano-containing polymer with a weight of 1 gm were pre-placed inside the 2" quartz tube of a furnace inside the heating zone. 2 gm of naphthalene was also placed in the quartz tube, but outside the heating zone and near the gas inlet. An inert gas, Argon was applied to purge air inside the quartz tube with a flow rate of 300 SCCM for 10 minutes and then the flow rate was decreased to 200 SCCM. The temperature was quickly increased from room temperature to 750° C. under the inert gas atmosphere in the high temperature furnace and then the quartz tube outside the heating zone with the naphthalene inside was quickly heated up to 75° C. by a heating tape. The evaporated naphthalene was blown into the high temperature zone in the quartz tube via the gas flow. After 50 minutes, the quartz tube was cooled down to room temperature and the gas flow turned off before the treated quartz plates were removed from the quartz tube. FIG. 4b shows a graphene-like network coated quartz plate.

When the temperature inside the quartz tube reached a high enough temperature (>500° C. in this case), the thermal degradation of pre-placed silicon-containing polymer or cyano-containing polymer would occur and the resulting gas would flow into the quartz tube. The composition of the gas may include $Si(CH_3)$—OH, $H_2Si(CH_3)_2$, $CH_4$, CO, and $O_2$, which were able to react with the edge carbons or defect carbons of graphene-like structures generated from the naphthalene (CVD carbon source) to form silicon carbide and silicon oxycarbide bonds. Since the quartz plate is composed of Si, C, O, N, etc, the silicon carbide and silicon oxycarbide bonds would have a great chance to form covalent bonds with the quartz plate at a temperature at or above 750° C.

Figure 5:
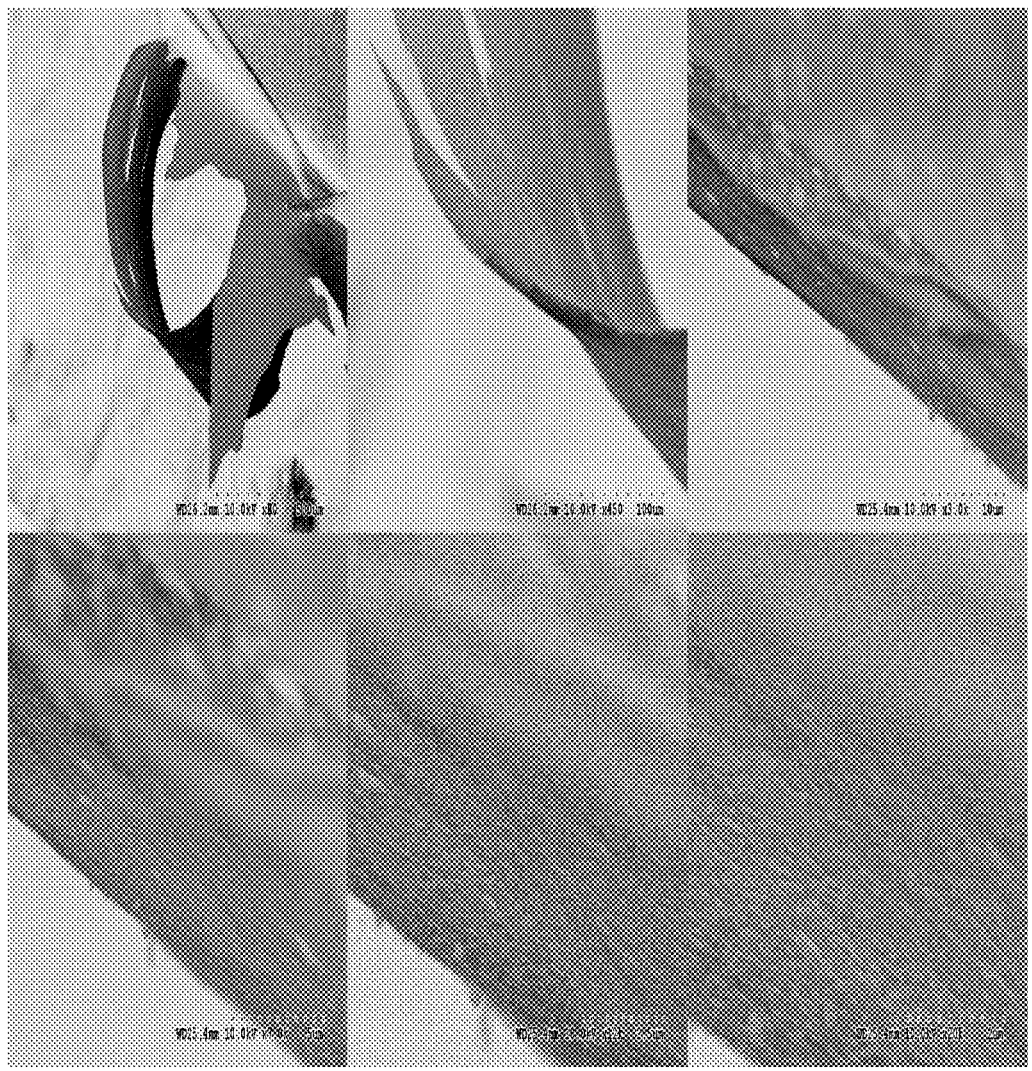
FIG. 5. SEM images of free standing graphene like coating.

FIG. 5 shows the SEM images of the graphene-like free standing coating on the quartz surface obtained by peeling the coating layer off from the copper foil substrate. It can be seen from FIG. 5 that the coating can be free standing with a thickness of ca. 3 μm.

For the carbide bonded coating on quartz from naphthalene, the surface electrical resistance of graphene-coated quartz is about 12-24K Ω with carbide bonding. In addition, the graphene coating is very strong and cannot be removed by sharp knife or strong acids. The coating exhibits Young's modulus of 170 GPa and Hertzian hardness of 22.5 GPa using a soft AFM diamond tip. The coating is stable up to 450° C., but can be oxygen-etched (i.e. burned) at temperatures higher than 450° C. for an extended time period (e.g. >1 hour), a typical characteristic of graphene/graphite materials. The graphene coating turned the quartz surface from hydrophilic to hydrophobic with less friction resistance.

Figure 6:
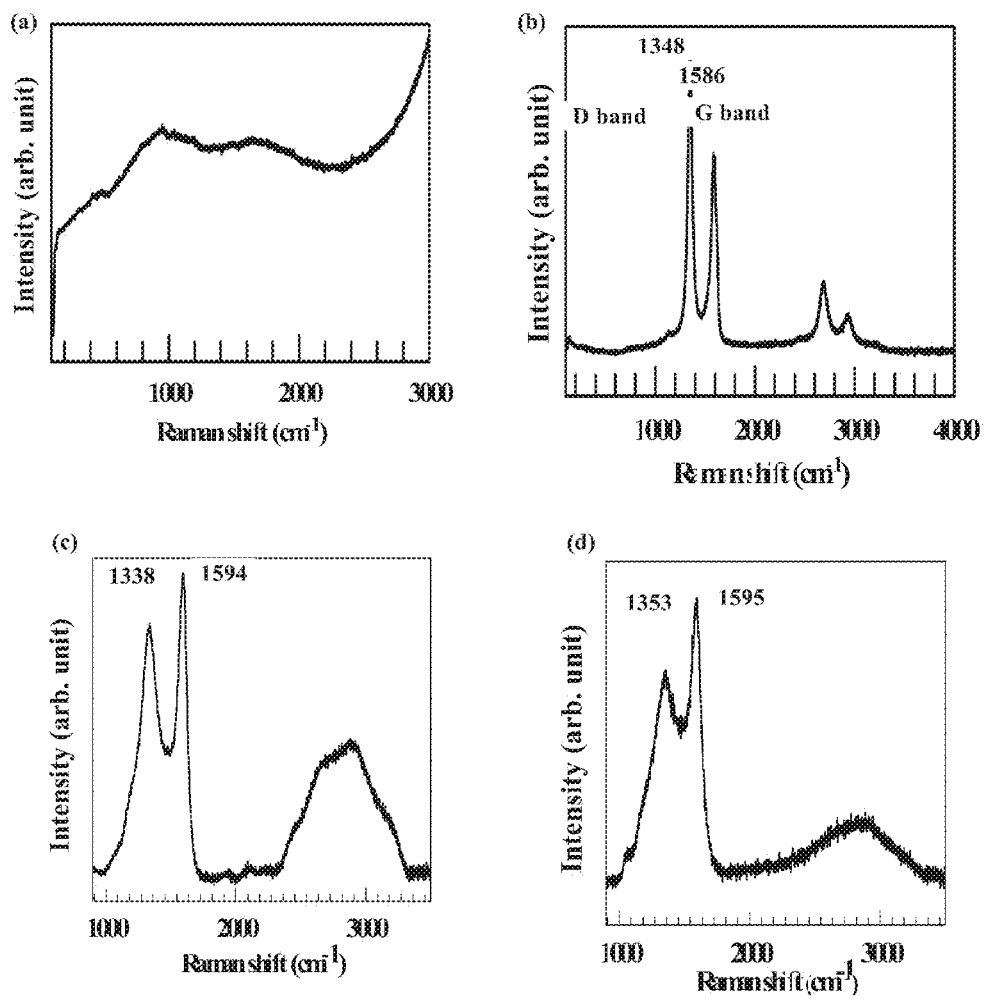
FIG. 6. Raman spectra of (a) quartz, (b) thermally reduced commercial graphene from graphene oxide, (c) quartz surface coated by CVD of naphthalene with carbide source, and (d) quartz surface coated by CVD of naphthalene without carbide source.

The Raman spectra of quartz and the graphene coated quartz samples were recorded using a Renishaw 1000 microspectrometer with an excitation wavelength of 514.5 nm. Raman spectroscopy is a useful nondestructive tool to characterize graphene materials, particularly for distinguishing ordered and disordered carbon structures, because Raman scattering is strongly sensitive to the change of electronic structure in the carbon materials. As seen from FIG. 6a, the quartz has strong photoluminescence which contributes to the background of graphene-coated quartz samples. In FIG. 6b, the Raman spectrum of a commercial graphene prepared by thermal reduction of graphene oxide has a G band at 1586 $cm^{-1}$ and a D band at 1348 $cm^{-1}$. The 2D band for the commercial graphene locates at 2703 $cm^{-1}$ where there is another new peak appearing at 2934 $cm^{-1}$, which is assigned to D+G combination band. These two bands result from the disordered structure of the commercial graphene. For graphene-coated quartz samples (FIGS. 6c,d) based on naphthalene, both the coating with and without silicon source possess clear G and D bands together with a board D+G combination band, revealing the presence of graphene within the coatings.

Example 2

Figure 7:
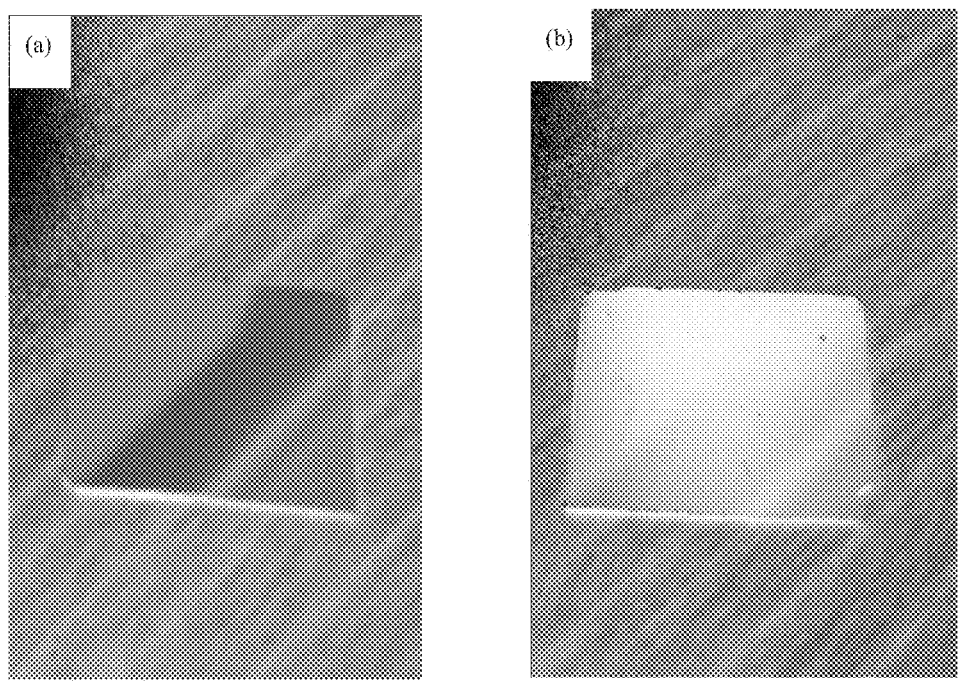
FIG. 7. Photos of (a) a Si wafer and (b) a graphene-like network coated Si wafer using CVD of naphthalene.

Silicon Carbide (and/or Silicon Oxycarbide) Bonded Graphene Network Coated on Silicon Wafers Using CVD of a Solid Carbon Source and a Silicon Source Similar to Example 1, two pieces of 2" diameter silicon wafers and 1 grams of silicon-containing polymer were placed in the quartz tube inside the heating zone of the high temperature furnace. 2 grams of naphthalene were also placed outside the heating zone in the quartz tube with Ar gas atmosphere at a flow rate same as in Example 1. A similar thermal cycle was applied for coating and then the silicon wafers were from the quartz tube. FIG. 7 shows a Si wafer and a graphene-like network coated Si wafer.

Example 3

Figure 8:
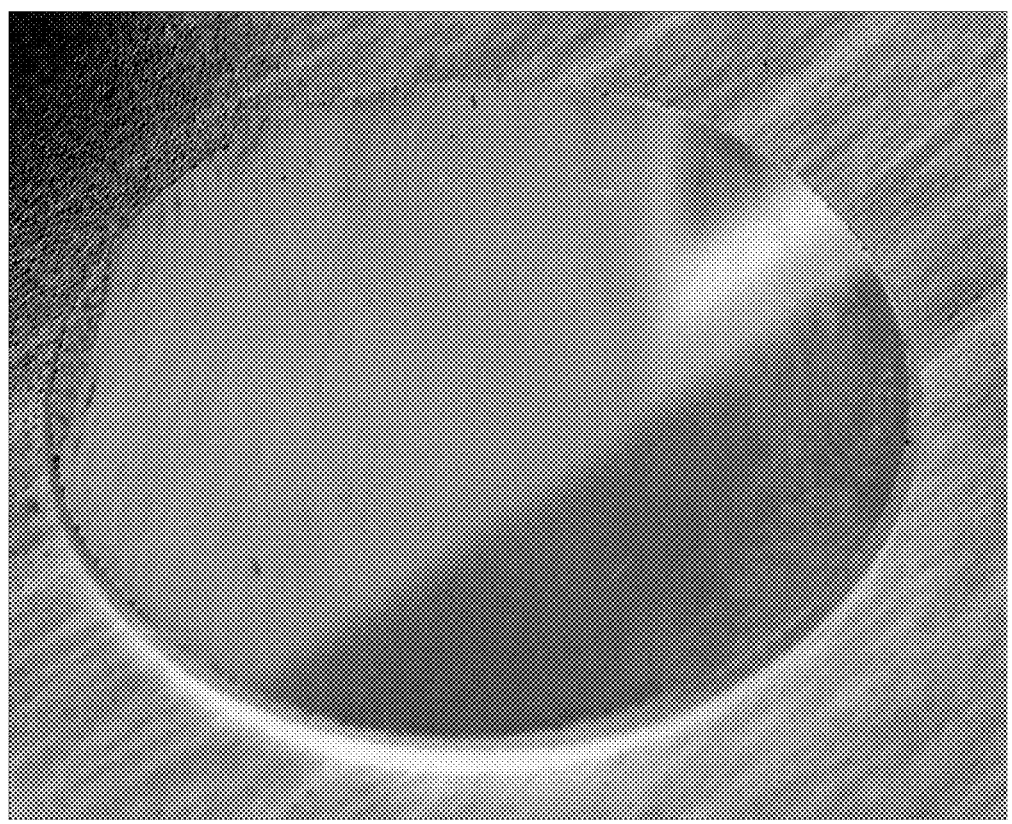
FIG. 8. Photo of a graphene-like network coated quartz plate using CVD of benzene.

Silicon Carbide (and/or Silicon Oxycarbide) Bonded Graphene-Like Network Coated on Quartz Plates Using CVD of Liquid Carbon Source and Liquid Silicon Source A liquid carbon source, benzene anhydrous (purchased from Aldrich, USA) with a purity of 99.8% in glass bubbler and a liquid silicon source, TMOS (Tetramethylorthosilicate, purchased from Aldrich, USA, 99.9%) in another glass bubbler were used for the purpose of graphene-like network and/or silicon carbide/oxycarbide bonded graphene-like network formation and surface coating. Two 1/16" thick quartz plates with 1"×3" dimension were pre-placed inside the 2" quartz tube of a furnace inside the heating zone. An inert gas, Argon was applied to purge air inside the quartz tube with a flow rate of 300 SCCM for 10 minutes and then the flow rate was decreased to 200 SCCM. The temperature was increased from room temperature to 950° C. (at 20° C./min) under the inert gas atmosphere. After the pre-specified temperature was reached, benzene/TMOS was introduced by bubbling with Ar as the carry gas (at 40 mL/min). After 60 minutes, the quartz tube was cooled down to room temperature and the gas flow turned off before the treated quartz plates were removed from the quartz tube. FIG. 2 and FIG. 8 show the schematic of the delivery system for liquid carbon sources and a graphene-like network coated quartz plate respectively.

Example 4

Figure 9:
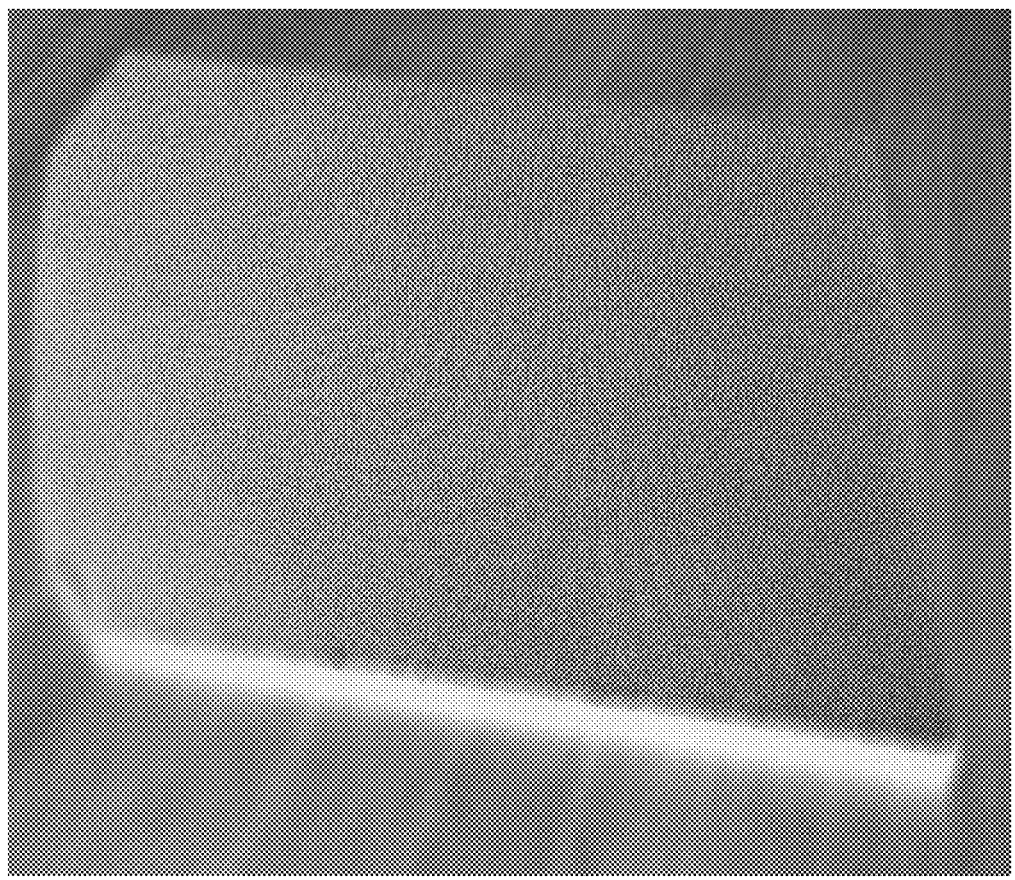
FIG. 9. Photo of a graphene-like network coated quartz plate using CVD of ethylene.

Silicon Carbide (and/or Silicon Oxycarbide) Bonded Graphene Network Coated on Quartz Plates Using CVD of Gas Carbon Source and Silicon-Containing Polymers A gas CVD carbon source, ethylene with a purity of 99.5%, was used for the purpose of graphene formation and solid surface coating. Two 1/8" thick quartz plates were pre-placed inside the quartz tube with a piece of silicon-containing polymer or cyano-containing polymer. An Ar gas was applied to remove air inside the quartz tube with a flow rate of 1000 SCCM for 10 minutes and then the flow rate was decreased to 530 SCCM. The temperature was quickly increased from room temperature to 950° C. under an Ar atmosphere by the high temperature furnace and then ethylene gas flow (30 SCCM) was applied together with the inert gas flow. After 50 minutes, the quartz tube was cooled down to room temperature before the treated quartz plate was removed from the quartz tube. FIG. 3 and FIG. 9 show the schematic of a delivery system for gas carbon sources and a graphene-like network coated quartz plate respectively.

Example 5

Silicon Carbide (and/or Silicon Oxycarbide) Bonded Graphene Network Coated on Steel Plates Using CVD of Solid Carbon Source and Silicon-Containing Polymers Similar to Example 1, two pieces of 1.5" diameter $SiO_2$ coated A10 steels and 1 grams of silicon-containing polymer were placed in the quartz tube inside the heating zone of the high temperature furnace. 2 grams of naphthalene were also placed outside the heating zone in the quartz tube with Ar gas atmosphere at a flow rate same as in Example 1. A similar thermal cycle was applied for coating and then the steels were removed from the quartz tube.

Example 6

Silicon Carbide (and/or Silicon Oxycarbide) Bonded Graphene Network Coated on Steel Plates Using CVD of Liquid Carbon Source and Silicon-Containing Polymers A liquid carbon source, toluene anhydrous (purchased from Aldrich, USA) with a purity of 99.8% in glass bubbler and a liquid silicon source, TEOS (Tetraethyl orthosilicate, purchased from Aldrich, USA, 99.9%) in another glass bubbler were used for the purpose of graphene-like network and/or silicon carbide/oxycarbide bonded graphene-like network formation and surface coating. Two $SiO_2$ coated steel pieces were pre-placed inside the 2" quartz tube of a furnace inside the heating zone. An inert gas, Argon was applied to purge air inside the quartz tube with a flow rate of 300 SCCM for 10 minutes and then the flow rate was decreased to 200 SCCM. The temperature was increased from room temperature to 850° C. (at 20° C./min) under the inert gas atmosphere. After the designed temperature was reached, toluene/TEOS was introduced by bubbling method with Ar as carry gas (at 40 mL/min). After 60 minutes, the quartz tube was cooled down to room temperature and the gas flow turned off before the treated quartz plates were removed from the quartz tube.

Property comparison of carbide bonded graphene-like network coated on quartz plates using graphene nanopaper and CVD of naphthalene, benzene and ethylene using atomic force microscope is given in FIG. 10. For comparison, the same properties of a bare hard steel and the same steel coated with diamond-like carbon (DLC) are also measured and presented in the same figure.

What is claimed is:
1. A method for coating a nanosheet structure network on a substrate, comprising:
providing a substrate and a polymer, wherein the polymer is selected from one of the group and combinations thereof consisting of a Si containing compound;
decomposing the Si containing compound in a furnace or the quartz tubes of a furnace to form a gas composition by heating at 500 to 1500° C. in an air free environment;
providing an argon gas as a carrier to deliver a hydrocarbon compound vapor to the furnace or quartz tubes of the furnace at 500 to 1500° C., so as to form a reactive species which is the gas composition decomposed from the Si containing compound and the hydrocarbon compound vapor; and depositing the reactive species on the substrate in the furnace or quartz tubes of the furnace at 500 to 1500° C. to form a nanosheet structure network having a covalent bond to the substrate.

2. The method of claim 1, wherein the substrate comprises ceramics, quartz, glass, silicon wafer and metals.

3. The method of claim 2, wherein the metal comprises structural steels, carbon steels, copper, titanium and the alloys thereof.

4. The method of claim 2, wherein the metal surface is pre-treated with a thin layer $SiO_2$ coating.

5. The method of claim 1, wherein the Si containing compound is selected from one of the group and combinations thereof consisting of silicone rubber, polydimethylsiloxane, organosilicon, silane-grafted polymers, silicon-containing metallocene polymers, polydimethylsiloxane and methyltrichlorosilane ($CH_3$—Si—$Cl_3$).

6. The method of claim 1, wherein the silicon containing compound further comprises fillers, gold, copper halide, and metallocenes.

7. The method of claim 1, wherein the temperature ranges from 750 to 950° C.

8. The method of claim 1, wherein the hydrocarbon compound comprises ketones, aldehydes, esters, alkane, alkene, and alkyne.

9. The method of claim 8, wherein the alkene is selected from one of the group and combinations thereof consisting of naphthalene, benzene, toluene, xylene, ethylene.

10. The method of claim 1, wherein the nanosheet structure network is a graphene-like network.

11. The method of claim 1, wherein the covalent bond is a carbide bond.

12. The method of claim 11, wherein the carbide bond is selected from the group and combinations thereof consisting of (-Carbon-Oxygen-Silicon-), (-Carbon-Silicon-), (-Carbon-Oxygen-Metal-), (-Carbon-Metal-), (-Carbon-Nitrogen-), (-Carbon-Nitrogen-Metal-).

13. A method for coating a nanosheet structure network on a substrate comprising:

providing a substrate into a furnace or quartz tubes of the furnace;

heating the furnace or quartz tubes of the furnace at 500 to 1500° C. in an air free environment;

providing an argon gas as a carry gas into the quartz tubes of the furnace at 500 to 1500° C. to deliver a vapor, wherein the vapor is consisting of a hydrocarbon compound and a silicon compound; and depositing the vapor on the substrate in the furnace or quartz tubes of the furnace at 500 to 1500° C. so as to form a nanosheet structure network having a covalent bond to the substrate.

14. The method of claim 13, wherein the substrate comprises ceramics, quartz, glass, silicon wafer and metals.

15. The method of claim 14, wherein the metal comprises structural steels, carbon steels, copper, titanium and the alloys thereof.

16. The method of claim 14, wherein the metal surface is pre-treated with a thin layer $SiO_2$ coating.

17. The method of claim 13, wherein the temperature ranges from 750 to 950° C.

18. The method of claim 13, wherein the hydrocarbon compound is selected from one of the group and combinations thereof consisting of benzene, toluene, xylene.

19. The method of claim 13, wherein the silicon compound is tetra-alkyl orthosilicate.

20. The method of claim 19, wherein the silicon compound is tetra-ethyl orthosilicate.

21. The method of claim 13, wherein the silicon compound further comprises fillers, gold, copper halide, and metallocenes.

22. The method of claim 13, wherein the nanosheet structure network is graphene-like network.

23. The method of claim 13, wherein the covalent bond is a carbide bond.

24. The method of claim 23, wherein the carbide bond is selected from one of the group and combinations thereof consisting of (-Carbon-Oxygen-Silicon-), (-Carbon-Silicon-).

* * * * *